(12) United States Patent
Zhang

(10) Patent No.: US 7,522,690 B2
(45) Date of Patent: Apr. 21, 2009

(54) JITTER SELF TEST

(75) Inventor: Ligang Zhang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 654 days.

(21) Appl. No.: 11/005,227

(22) Filed: Dec. 6, 2004

(65) Prior Publication Data

US 2006/0056561 A1    Mar. 16, 2006

Related U.S. Application Data

(60) Provisional application No. 60/610,061, filed on Sep. 15, 2004.

(51) Int. Cl.
    *H03D 3/24*      (2006.01)
(52) U.S. Cl. .................. 375/376; 375/215; 375/294; 375/147; 375/156; 375/371
(58) Field of Classification Search ............. 375/376, 375/215, 294, 371, 156; 327/147, 156, 294
See application file for complete search history.

(56) References Cited

U.S. PATENT DOCUMENTS

| | | | | |
|---|---|---|---|---|
| 6,275,553 | B1 * | 8/2001 | Esaki | 375/371 |
| 6,462,592 | B1 * | 10/2002 | Yoo | 327/147 |
| 6,670,852 | B1 | 12/2003 | Hauck | |
| 7,088,155 | B2 * | 8/2006 | Takahashi | 327/144 |
| 7,158,899 | B2 * | 1/2007 | Sunter et al. | 702/69 |
| 7,187,241 | B2 | 3/2007 | Hein et al. | |
| 2003/0125888 | A1 * | 7/2003 | Yamaguchi et al. | 702/69 |
| 2004/0232995 | A1 | 11/2004 | Thomsen et al. | |
| 2005/0220240 | A1 * | 10/2005 | Lesso | 375/372 |

* cited by examiner

*Primary Examiner*—Shuwang Liu
*Assistant Examiner*—Kabir A Timory
(74) *Attorney, Agent, or Firm*—Zagorin O'Brien Graham LLP

(57) ABSTRACT

Jitter is measured by receiving a first reference signal at a first phase-locked loop (PLL) circuit and generating at an output of the first phase-locked loop circuit an output signal based at least in part on the first reference signal, the output signal including a jitter component to be measured. A signal corresponding to the output signal and a signal corresponding to the first reference signal are compared in a phase detector of a second phase-locked loop circuit. A value corresponding to an output of the comparison is stored that includes information indicative of the measured jitter component.

28 Claims, 3 Drawing Sheets

JITTER SELF TEST

CROSS-REFERENCE TO RELATED APPLICATION(S)

This application claims benefit under 35 U.S.C. § 119(e) of application 60/610,061, filed Sep. 15, 2004, entitled "Jitter Self Test", naming Ligang Zhang as inventor.

BACKGROUND

1. Field of the Invention

This application relates to integrated circuit devices more particularly to testing for jitter present in integrated circuit devices.

2. Description of the Related Art

Many applications, such as optical transmission systems, use high speed clocks to synchronize the flow of data. Those high speed clocks typically include some level of jitter, which can lead to bit errors in the data being transmitted and possible degradation of system performance. Jitter is the variation in clock output frequency or phase from a desired output frequency or phase and can occur for a number of reasons. Jitter may be caused by noise introduced into the system from any of a variety of sources. An important area of jitter management is in the transmit path of an optical/electrical interface where the outgoing light pulses typically have jitter within tight system requirements. For example, for an OC-48 Synchronous Optical Network (SONET) system, having a data rate of approximately 2.5 GHz, transmit jitter is specified for frequencies from 12 KHz to 20 MHz. Other frequency bands may also be of interest for other applications. For example, an OC-192 SONET system specifies requirements for jitter frequencies from 50 KHz to 80 MHz.

In order to ensure that jitter specifications are being met, it can be important to accurately determine the jitter or phase noise present in a system. For high speed integrated circuits, measuring jitter can require expensive high speed equipment that can be time consuming to use. In addition, the external equipment allows noise sources to be coupled into the integrated circuit during measurement that may adversely affect the jitter measurement.

It would be desirable to provide a technique for measuring jitter performance that is low cost, reasonably reliable, and less complex than current techniques and can be used widely in evaluating and screening integrated circuits for jitter performance.

SUMMARY

Accordingly, in one embodiment, a method for measuring jitter is provided that includes receiving a first reference signal at a first phase-locked loop (PLL) circuit and generating at an output of the first phase-locked loop circuit an output signal based at least in part on the first reference signal, the output signal including a jitter component to be measured. During a first time period a first PLL signal corresponding to the output signal and a signal corresponding to the first reference signal are compared in a phase detector of a second phase-locked loop circuit. A value corresponding to the comparison that includes information indicative of the jitter component is stored. Jitter information may be subsequently retrieved by off-chip equipment.

In another embodiment, an integrated circuit is provided that includes a first phase-locked loop circuit coupled to receive a first reference signal and supply an output signal at an output of the phase-locked loop. A second phase-locked loop circuit is coupled to the output of the first phase-locked loop and compares, during a first time period, in a phase and frequency detector, a first signal corresponding to the output signal and a second signal corresponding to the first reference signal and generates a comparison indication. An analog to digital converts the comparison indication to a first digital representation. A storage that is coupled to the analog to digital converter stores a first value corresponding to the first digital representation that includes an indication of the jitter component.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
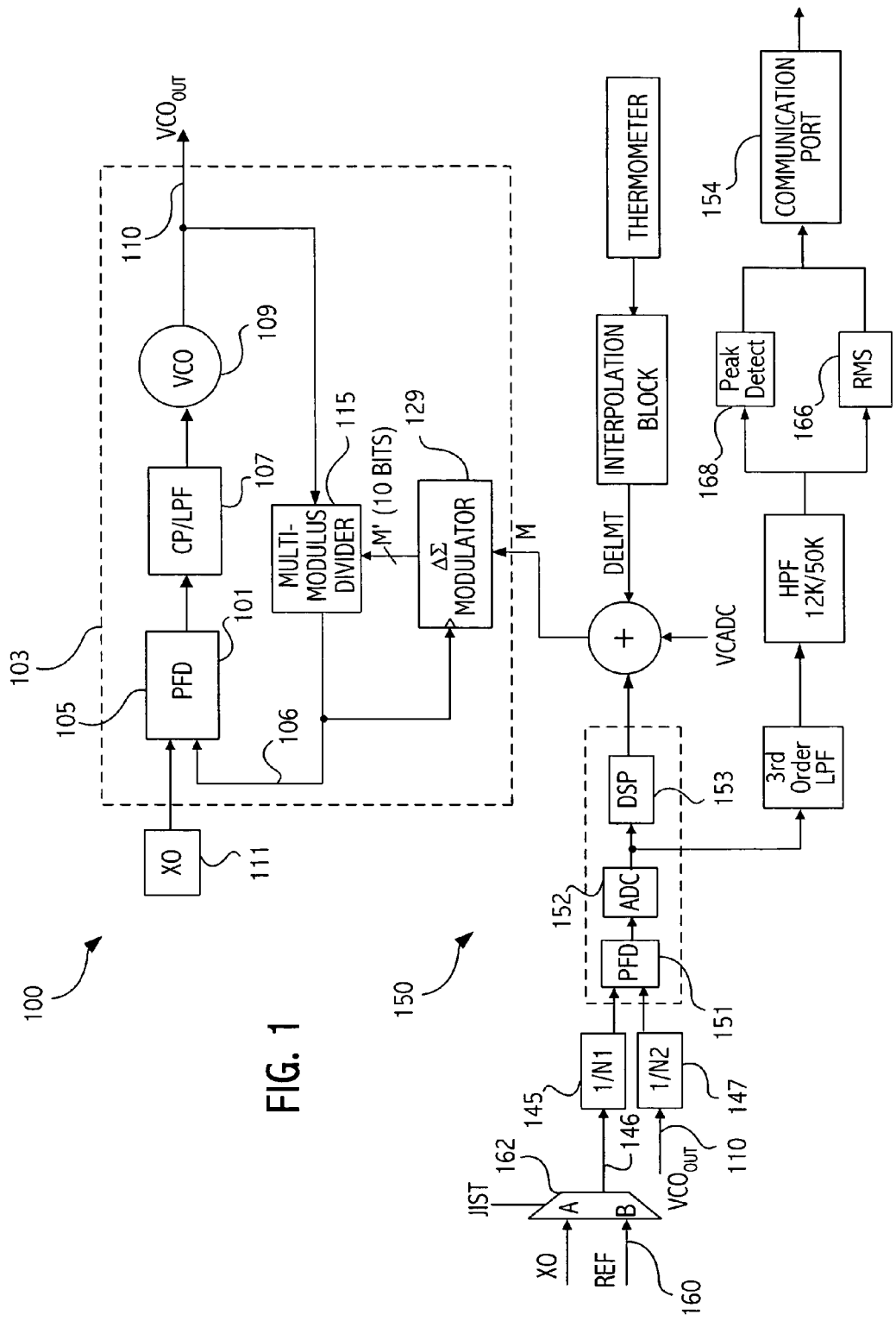
FIG. 1 illustrates a block diagram of an exemplary integrated circuit having a dual loop architecture suitable for measuring jitter according to an embodiment of the invention.

Referring to FIG. 1, illustrated is an exemplary embodiment of a dual loop architecture 100 that can advantageously exploit jitter self test concepts described herein. The dual loop architecture includes a digitally controlled oscillator (DCO) 103 also referred to herein as the "inner loop." The digitally controlled oscillator 103 is formed as a phase-locked loop and includes a phase/frequency detector (PFD) 105, a charge pump/loop filter 107 and a voltage controlled oscillator 109. The crystal (or surface acoustic wave (SAW) device) 111 supplies a timing reference to the DCO 103 as one input to the phase and frequency detector 105. Phase and frequency detector 105 generates an error term of the difference between the crystal oscillator input and the feedback from the VCO 109. Note that the feedback is supplied by multi-modulus divider block 115. In certain applications, the divider value of the "inner loop" 103 is controlled by an "outer loop" 150. An exemplary outer loop includes the dividers 145, 147, phase and frequency detector and analog to digital converter 151, filters 153.

The inner loop or DCO 103 may be a fractional N loop wherein a period of the reference clock supplied by crystal or SAW 11 may be a non-integer multiple of a period of the oscillator clock signal supplied by VCO 109. Fractional N phase-locked loops (PLLs) allow the multiplication of an incoming reference clock by a rational rather than an integer number to supply a wide variety of output frequencies. Using a fractional N loop allows the use of low cost timing reference such as a low cost crystal oscillator. Multiplying by a rational instead of an integer number, requires the use of a multi-modulus divider in the feedback path. Such a divider divides by a sequence of integers that over time approximates the rational number desired. This sequence can be generated by a digital delta sigma modulator 129.

The fractional N loop can be viewed as a digitally controlled oscillator, where the output frequency is controlled by the rational digital number M according to Fout=M×Fref. Thus, the DCO 103 can be implemented as a fractional N PLL providing a wide range of output frequencies $f_{osc}=M \times f_x$, where $f_x$ is supplied from oscillator 111 and M is provided by the outer loop or another source. The precision of M can be to the level of a few parts per billion. One important criteria in some applications is to ensure that a DCO, such as illustrated in FIG. 1, meets the phase noise specifications typically achieved by a fixed frequency crystal or SAW based oscillator. A standard of interest would be for example the SONET standard for jitter generation.

The overall noise contribution from the fractional PLL depends on several factors. One factor is the update rate of the PLL (generally the reference clock rate from XO 111 in the illustrated embodiment to the) and the loop bandwidth of the PLL, a measure similar to the oversampling ratio (OSR) in delta sigma analog to digital converters (ADCs). A higher OSR allows for better suppression of fractional-N divider noise in the band of interest. For a given update rate the noise contribution can be reduced by lowering the loop bandwidth.

In addition to the noise sources stated above, several other sources contribute to noise in a PLL. Another contributor is noise from the voltage controlled oscillator (VCO). An integrated LC VCO exhibits 3 noise regions, close in $1/f^3$, intermediate $1/f^2$, and high frequency white noise that is frequency independent. For example, exemplary corners defining the three regions are at 100 KHz and 100 MHz. For an integrated LC VCO oscillating in the GHz range, the $1/f^3$ region is significant, whereas the white noise region is insignificant. When embedded in a PLL the noise transfer function to the output of the PLL is a high pass filter with a corner at the loop bandwidth. Wider loop bandwidth improves the noise contribution from the VCO. If the bandwidth of the loop exceeds the $1/f^3$ corner of the oscillator, the VCO phase noise performance tends to be very competitive with the performance of prior art fixed frequency crystal or SAW based oscillators in applications such as SONET. Another contributor to noise in a PLL is noise from the reference clock, i.e., in the embodiment in FIG. 1 from the crystal oscillator. Narrower loop bandwidth improves the noise contribution of this source.

The choice of loop bandwidth is an optimization to reduce noise from various sources. Given today's state of the art in LC oscillator design in terms of phase noise and oscillation frequency, and the ability of a state of the art CMOS process to implement a high speed multi-modulus divider and a high speed delta sigma modulator, it is now possible to better optimize the noise budget to yield a clock source that can exceed standards such as SONET.

Good jitter performance of the DCO loop is facilitated by implementation of the loop filter as a digital filter, which is a technique that allows an accurate implementation of the loop filter that is properly matched to the corners and the order of the noise shaping function and therefore can best reduce the jitter contribution from that source. Digital loop filter implementations are known in the art and described, e.g., in U.S. Pat. No. 6,630,868, entitled "Digitally Synthesized Loop Filter Circuit Particularly Useful for a Phase Locked Loop", naming Perrott et al. as inventors, which patent is incorporated herein by reference, and in application Ser. No. 10/188,576, filed Jul. 2, 2002, entitled "Digital Expander Apparatus and Method for Generating Multiple Analog Control Signals Particularly Useful for Controlling a Sub-Varactor array of a Voltage Controlled Oscillator", naming Yunteng Huang and Bruno W. Garlepp as inventors, which application is incorporated herein by reference.

Additionally, the current phase error can be computed as the integral of all instantaneous frequency errors as they were computed in the delta sigma modulator that controls the multi modulus divider. Through subtraction in the analog or digital domain, the phase error can be cancelled and thus strongly reduced as a noise source. As a result the bandwidth can be increased and thus overall better jitter performance can be achieved. Additional details on phase error correction can be found in U.S. application Ser. No. 10/878,089, filed Jun. 28, 2004 entitled "Phase Error Cancellation" naming Doug Frey as an inventor, which application is incorporated herein by reference.

The dual loop architecture illustrated in FIG. 1 can be configured to function as a clock source, e.g., as a voltage-controlled crystal oscillator or SAW oscillator (VCXO/VCSO) or as a fixed-frequency clock source (XO/SO). In voltage-controlled oscillator operational mode a control voltage is received on the VC analog voltage (not shown in FIG. 1). An on-chip analog to digital converter (ADC) converts the control voltage VC into a digital control word (VCADC) supplied to summing circuit 115, which generates the digital control signal M for the DCO 103. The control voltage VCADC may also be summed in summing circuit 115 with a temperature compensation value (DELMT), and the sum is supplied to DCO 103 as the control signal M, which controls the DCO output.

In other embodiments the dual loop architecture can be used as a clock multiplier. In one embodiment as a clock multiplier, the inner loop generates a multiple of the reference clock provided on node 160. Additional details on the dual loop architecture both as a clock source and a clock multiplier can be found in the application entitled "Dual Loop Architecture Useful for a Programmable Clock Source and Clock Multiplier Applications", naming Axel Thomsen et al. as inventors, application Ser. No. 10/878,218, filed Jun. 28, 2004, which application is incorporated by reference herein. Note that when being used as a clock multiplier, the outer loop bandwidth is low to minimize jitter transfer from jitter present in the reference signal REF supplied on node 160.

The use of a DCO as a clock source has several advantages. Digital control of the output frequency allows for storage of calibration parameters in non-volatile memory. When the outer loop is in lock to a reference frequency, the value present at the input to the DCO 103 is the proper multiplier to achieve this frequency in an open loop operation. Therefore this value can be stored while in lock and recalled later for operation in open loop as a clock source. Depending on specific implementations, the loop bandwidth of the inner loop may range, e.g., from approximately 10 KHz to approximately 10 MHz. The loop bandwidth of the outer loop is preferably substantially lower, e.g., ranging from approximately 12.5 KHz to 50 Hz or even less. In various embodiments, the loop bandwidth of the outer loop may be configurable to have two or more values or may be fixed to a single value. Note that the inner loop is implemented to adjust quickly to changes as compared with the outer loop.

The phase noise performance, as described above, can be an important criteria in applications such as SONET systems. Thus, the ability to measure phase noise performance of the dual loop architecture would be very useful. According to one embodiment, in order to measure phase noise performance, the outer loop is configured to measure the phase noise of the clock generated by the inner loop. That allows an integrated circuit to test itself for jitter performance and efficiently utilizes available circuitry. Referring still to FIG. 1, the output of the VCO is supplied to the PFD 151 of the outer loop via node 110 and divider 147. PFD 151 compares the VCO output to a signal supplied on node 146 and generates a difference value that provides the basis for a measurement of the phase noise performance. Note that in one embodiment, the expected jitter is in the sub picosecond range, e.g., 0.2 or 0.3 picoseconds.

Note that while a divider 147 is shown, the number of dividers between VCO 109 and PFD 151 and their value may vary according to system requirements. In operational mode, such as for a clock multiplier application, multiplexer 162 selects a reference signal on node 160 that is supplied from an input terminal of the integrated circuit. In order to measure jitter accurately, it is desirable to have a high frequency clean reference clock, i.e., one that does not contribute a significant amount of jitter itself. Accordingly in jitter self test (JIST) mode, multiplexer 162 selects the XO signal from crystal oscillator 111, which provides a clock source with good noise characteristics. The crystal oscillator is utilized by the inner loop and thus provides a convenient reference clock source for JIST mode for the outer loop. In one embodiment, the inner loop bandwidth is approximately 2 MHz. Other embodiments may have a different inner loop bandwidth, e.g., 1 MHz.

Because the goal is to measure jitter, it is of interest to determine the bandwidth in which noise needs to be measured. The inner loop design may cause the frequency content of phase noise to be below a particular value, e.g., approximately 12 MHz. The frequency band in which the phase noise is concentrated is further defined by the inner loop bandwidth. Thus, with an inner loop bandwidth of 2 MHz, in one embodiment, the phase noise will be concentrated between approximately 2 MHz and approximately 12 MHz. With a different inner loop design and bandwidth, the noise will be concentrated in a different frequency band, e.g. between approximately 1 MHz and approximately 6 MHz. The frequency band in which noise is concentrated will be determined according to particular requirements of the inner loop. The outer loop has a relatively low bandwidth as described previously and contributes little noise to the overall jitter. The inner loop contributes the most noise, particularly from the feedback divider and the VCO. Note that if the contribution to noise from the high frequency portion of the spectrum is insignificant, e.g., >12 MHz, that contribution can be ignored in determining the jitter measurement without significantly adversely affecting the measurement results. That can simplify implementation of the jitter self test technique.

In order to measure jitter at the output of the VCO, i.e., at the output of the inner loop, the phase noise is converted into voltage and the voltage into a digital value, which is then used in determining the jitter measurement.

There are several types of jitter measurements that may be made. One type is an RMS measurement. In order to provide an RMS measurement, in one embodiment, the $\Sigma data^2$ is determined and stored in RMS logic 166. The RMS logic performs both a multiplication (square operation on the data) as well as a sum operation and stores the result. Such arithmetic circuits to perform the square and sum operations are well known in the art. In addition, the number of samples taken may also be determined using a counter and stored. The RMS measurement may then be determined conventionally as $\sqrt{\Sigma data^2}$/number of samples. That determination may be made by post processing. For example, a communication port on the integrated circuit may provide read access to storage locations in the RMS logic 166 storing the measurement information, which can then be post processed off-chip.

In addition, or as an alternative to an RMS measurement, a peak to peak jitter measurement may be determined and stored in on-chip peak to peak detect logic 168 for subsequent retrieval by off-chip post processing devices. The peak to peak logic keeps the maximum peak to peak measurement as well as the minimum. The logic to implement the compare function to determine the peak to peak measurement as well as to determine the minimum of the peak to peak measurements is also well known in the art and not further described here. Additional jitter information, e.g., the mean of the peak to peak measurements, may also be determined in a manner known in the art. Because the jitter information is accumulated on chip, the information can be read at a much lower rate by off-chip equipment. For example, the data may be read from the integrated circuit at the kilohertz rate.

An important component of the phase noise performance measurement is the analog to digital converter that converts the phase error to a digital value in the inner loop.

Figure 2:
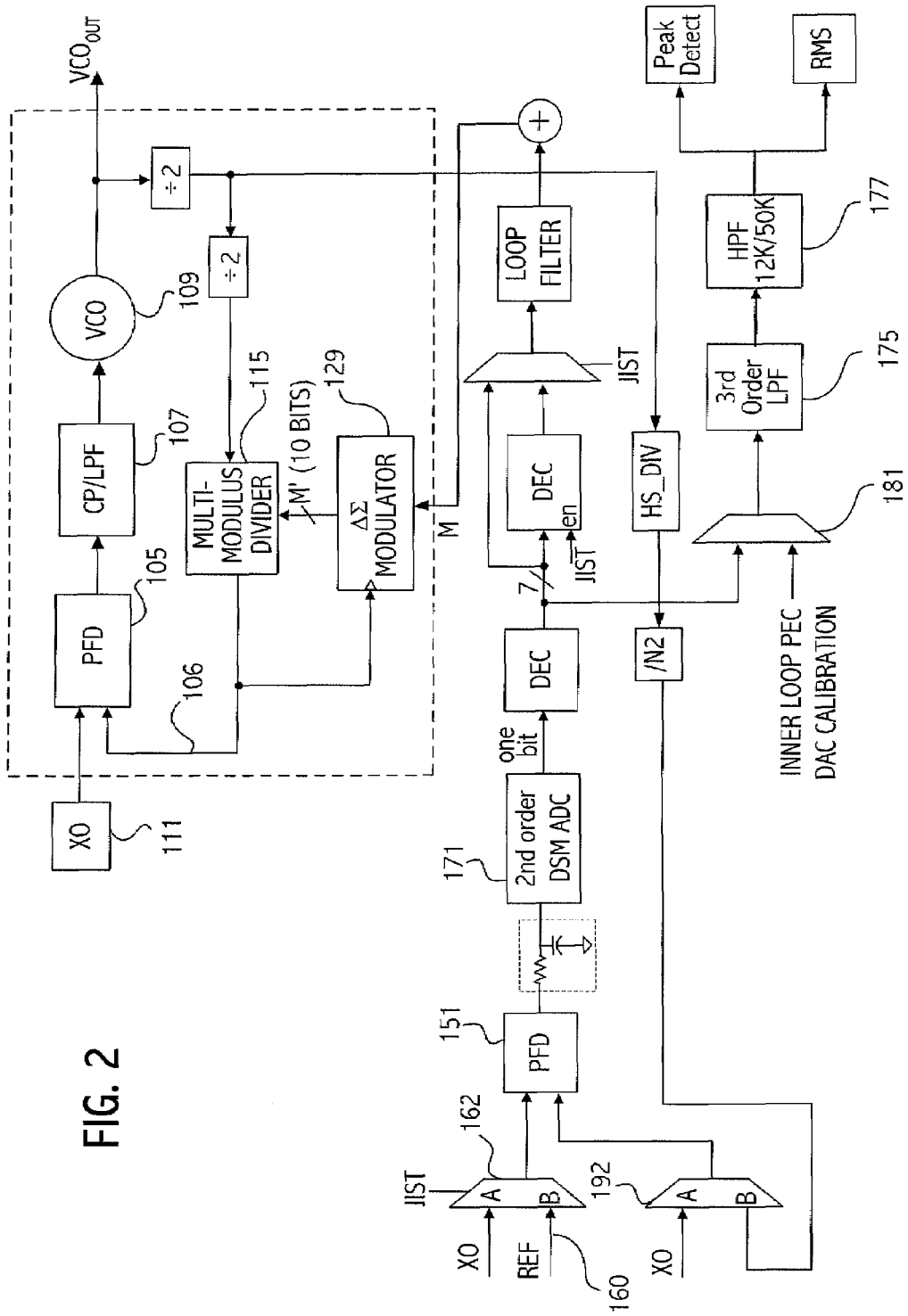
FIG. 2 illustrates a block diagram of another embodiment of a dual loop architecture suitable for measuring jitter according to an embodiment of the invention.

Referring to FIG. 2, additional details of an embodiment of the invention are illustrated. The analog to digital converter 171 in the outer loop should be designed so as to not attenuate the signal being measured, which in one embodiment, is an approximately 10 MHz signal. In one embodiment, a second order delta sigma modulator is used to perform the analog to digital conversion. In normal operational mode, e.g., in clock source calibration mode or in clock multiplier mode, the analog to digital converter may run at a slower speed than in jitter self test mode. In one embodiment, the outer loop PFD is designed to receive 2K to 2 MHz signals and to run at 40 MHz. In that embodiment, the ADC 171 runs at 40 MHz in normal operational mode and at 622 MHz in jitter self test mode. It is desirable to have a higher clock rate in the ADC mode during jitter test mode in order to provide a more accurate analog to digital conversion.

Figure 3:
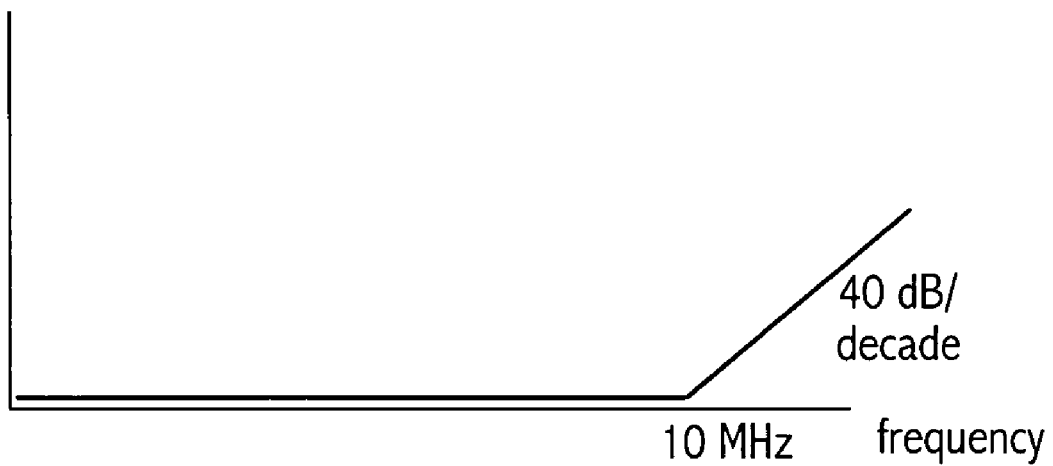
FIG. 3 illustrates a noise profile of an analog to digital converter (ADC) utilized in measuring phase noise performance in an embodiment of the invention.

Note that the embodiment illustrated in FIG. 2, the outer loop does not have filters like the inner loop does. The ADC presents some noise at the output and that noise, if below 10 MHz, can not be filtered or the filter(s) could cut off the approximately 10 MHz signal that is being measured. It would be desirable to have the noise out of the ADC have a profile as shown in FIG. 3 where the ADC provides little or no noise contribution in the frequencies of interest, e.g., below 10 MHz and then can rise outside of the frequency band of interest. Assuming the ADC quantization noise contributes less than 50 femtoseconds of RMS noise itself after a digital $3^{rd}$ order low pass filter (LPF), the ADC would be operating at approximately 30 dB better than the ADC utilized for normal operation in the inner loop.

There are several ways to achieve such an improved noise profile. One way is to increase the sampling frequency of the analog to digital converter and thus the increase to 622 MHz in jitter self test mode. A further doubling of the sampling frequency can provide a 15 dB improvement. Assuming the ADC is operating at approximately 622 MHz, increasing the sampling frequency to 2.4 GHz would achieve 30 dB improvement. Another way to achieve the noise profile desired is to use a small measurement range of the ADC. In other words reduce the full scale of the ADC. For example, to achieve a 30 dB improvement, the full scale can be reduced from +/−66.7 pS to +/−2 pS. Since the size of the signal being measured is small, reducing the full scale of the ADC should be acceptable for measuring jitter. A combination of increasing the sampling frequency and reducing full scale can be utilized to achieve the improvement desired. Note that the need to improve the operation of the ADC is because the ADC utilized in one particular embodiment is utilized in the outer loop in normal operational mode. In other embodiments, a dedicated ADC may be implemented for jitter self test purposes. That has the advantage of designing an ADC for a specific task but the disadvantage of increased chip area. Note that power consumed by the test circuitry is assumed not to be a consideration assuming that the circuits dedicated to test functions are powered off during normal operation.

In an embodiment where it is desirable to avoid significantly changing operation of the outer loop ADC, a jitter test calibration phase may be used to calibrate out the quantization noise associated with the ADC. Because the signal that is being measured is actually wide-band noise, if the assumption is made that the quantization noise of the ADC is truly random with no tones, its RMS and peak to peak (PP) noise should add in RMS and PP fashion with its signal (phase noise in this case) and be calibrated out. Calibrating out the quantization noise allows the use of a significantly degraded ADC, compared to what otherwise would be required without the jitter test calibration approach. Note that this calibration technique can advantageously calibrate out a significant portion of the charge pump noise.

In order to perform this calibration phase, and determine the noise contribution from the ADC, in one embodiment, the inputs to the PFD in the outer loop are shorted together. That is, the two signals compared by the PFD are the same signal. That may be accomplished by selecting the XO input in multiplexers 162 and 192. The resulting RMS and PP phase noise measurements $\phi_{RMSADC}^2$ and $\phi_{PPADC}$ are indicative of the quantization noise of the ADC. Then the phase noise is measured by comparing XO to the VCO output and the resultant RMS and PP phase noise measurements include the phase noise associated with the signal and the quantization noise associated with the ADC. The RMS phase noise associated with the signal can then be determined as follows:

$$\phi_{RMS(ADC+SIGNAL)}^2 - \phi_{RMSADC}^2 = \phi_{SIGNAL}^2$$

Similarly, the peak to peak phase noise value can be determined:

$$\phi_{PP(ADC+SIGNAL)} - \phi_{PPADC} = \phi_{PPSIGNAL}.$$

The ADC may generate noise on the order of the signal trying to be measured. It is preferable that the quantization noise is smaller than the signal noise. The second order ADC noise rises at 40 dB/decade. Referring again to FIG. 2, a third order low pass filter (LPF) 175 is utilized to filter the quantization noise from an ADC 171. Note that the third order LPF 175 may be implemented as a digital filter. The third order low pass filter 175 causes the noise to drop at 20 dB/decade. While the third order filter does not need to be exact, it is desirable to have a sharp roll off out of band and let the signal pass within band. In one embodiment, the corner of the low pass filter is set at approximately 6.25 MHz or 12.5 MHz according to the frequency content of the noise. Other embodiments may select a different low pass corner frequency.

Various applications specify jitter requirements in particular frequency bands. For example, as pointed out above, OC-48 specifies jitter in a frequency band of 12 KHz to 20 MHz. OC-192 specifies jitter frequency in a band of 50 KHz to 80 MHz. Thus, it is desirable that the jitter self test described herein be capable of measuring jitter in a particular frequency band and more particularly in multiple frequency bands if the integrated circuit being tested can be used in applications having different frequency bands of interest.

In one embodiment, high pass filter 177 can be selectably set to set a lower corner at 12.5 KHz or at 50 KHz. If the contributions to jitter are insignificant above 20 MHz or 80 MHz, wherever the frequency band of interest ends, then integrating noise without providing a high corner for a band-pass filter may provide sufficiently accurate jitter information. The use of the third order LPF after the ADC suppresses any noise content beyond LPF corners anyway.

In other embodiments, other frequency bands may be of interest. Because the outer loop as a relatively low bandwidth, the outer loop bandwidth may be used to emulate the lower corner of a high pass filter. For example, if a frequency band of 10 Hz to 20 MHz is of interest, the lower corner may be set by setting the bandwidth of the outer loop to 10 Hz. Similarly, the bandwidth of the outer loop may be set to 800 Hz to emulate a lower corner of a high pass filter function.

Note that if a crystal (or SAW) oscillator supplied to the inner loop is also being used as a reference in the outer loop against which the VCO output is being compared, the VCO output should be selected to be an integer multiple of the crystal oscillator output. Additionally, in embodiments in which the inner loop is a fractional-N loop, the fractional N delta sigma modulator should be turned on during the jitter test to more effectively measure the jitter generated by the inner loop in an operational environment.

In addition to evaluation noise performance internally, the jitter measurement technique can be used to measure jitter of an external clock. Assume that a particular integrated circuit incorporating the jitter test logic described herein has been tested and has been found to be a particularly low jitter part. This "golden" part can then be used to test jitter present in other integrated circuits. For example, referring again to FIG. 2, when testing an external clock in external jitter test mode, the REF signal supplied on node 190 160 is selected by multiplexer 162. That REF signal is the signal generated by another integrated circuit to be tested and is compared in PFD 151 to the output of the VCO of the "golden" part, which has low jitter.

In addition to evaluating phase noise performance, the internal jitter monitor technique can be used to fine tune circuit parameters to minimize jitter. In phase error correction, a digital word may be generated, indicative of the phase error generated by the fractional-N divider as described in U.S. application Ser. No. 10/878,089, filed Jun. 28, 2004 entitled "Phase Error Cancellation" previously incorporated by reference. However, the phase error correction (PEC) may be sensitive to the gain mismatch between the digital phase error word and its analog DAC output counterpart. In one embodiment, the PEC DAC output is supplied to the charge pump to offset the error generated by the fractional-N divider. Using the phase error measurement technique described herein, the gain mismatch can be calibrated out by adjusting the analog DAC output to reduce the measured jitter. In one such implementation, an additional small DAC is used around the master bias of the PEC DAC and is adjusted to minimize the jitter that is measured by the jitter measurement techniques described herein. In fact, the jitter measurement techniques described herein can be used generally wherever circuits that affect jitter performance can be adjusted.

Thus, various embodiments have been described for implementing an approach for measuring phase noise. The description of the invention set forth herein is illustrative, and is not intended to limit the scope of the invention as set forth in the following claims. For example, while a phase and frequency detector (PFD) has been described, in fact certain embodiments may use a phase detector circuit, while other embodiments may use a phase detector incorporated in a phase and frequency detector. Other variations and modifications of the embodiments disclosed herein, may be made based on the description set forth herein, without departing from the scope of the invention as set forth in the following claims.

What is claimed is:

1. A method for measuring jitter comprising:
   receiving a first reference signal at a first phase-locked loop (PLL) circuit;

generating at an output of the first phase-locked loop circuit an output signal based at least in part on the first reference signal, the output signal including a jitter component to be measured;

during a first time period comparing a first signal corresponding to the output signal and a second signal corresponding to the first reference signal in a phase detector of a second phase-locked loop circuit;

storing a first value corresponding to the comparison that includes information indicative of the jitter component;

wherein the first value includes the jitter component and a noise component that is associated with an analog to digital converter of the second phase-locked loop circuit and wherein the method further comprises:

during a second time period supplying a third and fourth signal to a first and a second input of the phase detector of the second phase-locked loop circuit, the third and fourth signal being the same signal;

during the second time period comparing the third and fourth signals in the phase detector of the second phase-locked loop circuit; and storing a second value corresponding to the comparison of the third and fourth signals as an indication of a noise component associated with the analog to digital converter in the second phase-locked loop circuit.

2. The method as recited in claim 1 further comprising controlling a divide ratio of a feedback divider of the first phase-locked loop using the second phase-locked loop circuit.

3. The method as recited in claim 1 wherein the third and fourth signals correspond to the first reference signal.

4. The method as recited in claim 3 supplying the first reference signal from one of a crystal oscillator and a surface acoustic wave oscillator.

5. The method as recited in claim 1 further comprising subtracting the second value from the first value to generate a jitter indication.

6. The method as recited in claim 1 further comprising wherein the first and second values are peak detection values.

7. The method as recited in claim 1 further comprising wherein the first and second values are RMS values.

8. The method as recited in claim 1 further comprising storing an RMS value indicative of an RMS jitter value.

9. The method as recited in claim 1 further comprising utilizing the analog to digital converter to generate a digital value corresponding to the comparison.

10. The method as recited in claim 1 further comprising:
converting the comparison of the first signal and the second signal in the phase detector to a digital representation in an analog to digital converter;
filtering the digital representation; and
storing the filtered digital representation as the first value.

11. The method as recited in claim 1 wherein the first value is a peak detection value.

12. The method as recited in claim 1 wherein the first value is an RMS value.

13. The method as recited in claim 1 further comprising supplying the first value to a communication port of an integrated circuit.

14. The method as recited in claim 1 selectively measuring the jitter component in different bandwidths.

15. The method as recited in claim 1 further comprising adjusting a bandwidth of the second phase-locked loop circuit to select a lower corner of a bandwidth in which to measure jitter.

16. The method as recited in claim 1 selectively clocking the analog to digital converter at a first clock rate while measuring jitter and a second clock rate in an operational mode.

17. The method as recited in claim 1 further comprising a phase and frequency detector incorporating the phase detector.

18. An integrated circuit comprising:
a first phase-locked loop circuit coupled to receive a first reference signal and supply an output signal at an output of the phase-locked loop;
a second phase-locked loop circuit coupled to the output of the first phase-locked loop and coupled to compare, during a first time period, in a phase and frequency detector, a first signal corresponding to the output signal and a second signal corresponding to the first reference signal and generate a comparison indication;
an analog to digital converter in the second phase-locked loop coupled to convert the comparison indication to a first digital representation;
a storage coupled to the analog to digital converter for storing a first value corresponding to the first digital representation that includes an indication of the jitter component; and
wherein the phase and frequency detector is coupled to compare a third and fourth signals during a second time period, the third and fourth signals being the same, and generate a comparison indication as an indication of a noise component associated with the analog to digital converter.

19. The integrated circuit as recited in claim 18 further comprising a low pass filter coupled between the analog to digital converter and the storage and wherein the first digital representation is low pass filtered prior to being stored in the storage.

20. The integrated circuit as recited in claim 18 wherein the second phase-locked loop circuit is coupled to control a divide ratio of a feedback divider of the first phase-locked loop circuit.

21. The integrated circuit as recited in claim 18 wherein the first value includes a jitter component and a noise component associated with the analog to digital converter.

22. The integrated circuit as recited in claim 18 wherein the third and fourth signals correspond to the first reference signal.

23. The integrated circuit as recited in claim 18 wherein the analog to digital converter generates a second digital value corresponding to the comparison indication of the third and fourth signals and wherein a second value corresponding to the second digital value is stored.

24. The integrated circuit as recited in claim 23 wherein the second digital value is low pass filtered prior to be stored.

25. The integrated circuit as recited in claim 23 wherein the first and second values are peak detection values.

26. The integrated circuit as recited in claim 23 wherein the first and second values are RMS values.

27. The integrated circuit as recited in claim 18 further comprising a communication port for supplying the first value externally to the integrated circuit.

28. The integrated circuit as recited in claim 18 further comprising a high pass filter coupled between the digital to analog converter and the storage.

* * * * *

UNITED STATES PATENT AND TRADEMARK OFFICE
CERTIFICATE OF CORRECTION

PATENT NO. : 7,522,690 B2  Page 1 of 1
APPLICATION NO. : 11/005227
DATED : April 21, 2009
INVENTOR(S) : Ligang Zhang It is certified that error appears in the above-identified patent and that said Letters Patent is hereby corrected as shown below:

Col. 1, line 13, please replace "devices more" with --devices, and more--
Col. 2, line 6, please replace "digital converts" to --digital converter converts--
Col. 3, line 15, please replace "embodiment to the) and" with --embodiment) and--
Col. 6, line 31, please replace "that the" with --that in the--
Col. 8, line 2, please replace "loop as a" with --loop has a--
Col. 8, line 26, please replace "node 190 160" with --node 160--

Signed and Sealed this

Thirtieth Day of June, 2009

JOHN DOLL
*Acting Director of the United States Patent and Trademark Office*